(12) United States Patent
Isoda

(10) Patent No.: US 9,942,494 B2
(45) Date of Patent: Apr. 10, 2018

(54) CURRENT-VOLTAGE CONVERTER, PHOTOELECTRIC CONVERSION DEVICE, AND CAMERA

(71) Applicant: CANON KABUSHIKI KAISHA, Tokyo (JP)

(72) Inventor: Naoki Isoda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/450,747

(22) Filed: Mar. 6, 2017

(65) Prior Publication Data
US 2017/0280081 A1   Sep. 28, 2017

(30) Foreign Application Priority Data
Mar. 24, 2016   (JP) ................................. 2016-060899

(51) Int. Cl.
| | |
|---|---|
| H04N 5/355 | (2011.01) |
| H04N 5/378 | (2011.01) |
| G05F 1/56 | (2006.01) |
| H01L 31/103 | (2006.01) |

(52) U.S. Cl.
CPC ......... *H04N 5/35518* (2013.01); *G05F 1/561* (2013.01); *H01L 31/103* (2013.01); *H04N 5/378* (2013.01)

(58) Field of Classification Search
CPC ............................................. H04N 5/30–5/378
See application file for complete search history.

(56) References Cited

U.S. PATENT DOCUMENTS

| | | | | |
|---|---|---|---|---|
| 5,646,573 A | * | 7/1997 | Bayruns | ............ H03F 1/08 250/214 A |
| 7,755,411 B2 | | 7/2010 | Isoda | |
| 8,174,317 B2 | | 5/2012 | Isoda | |
| 2015/0188537 A1 | | 7/2015 | Isoda | |
| 2016/0308496 A1 | | 10/2016 | Isoda | |

FOREIGN PATENT DOCUMENTS

| | | |
|---|---|---|
| JP | H01-240002 A | 9/1989 |
| JP | H11-008517 A | 1/1999 |
| JP | 2000-315923 A | 11/2000 |
| JP | 2012-247233 A | 12/2012 |

OTHER PUBLICATIONS

Zenta Iwai, et al., "Control Enginnering", p. 17, expression (2.33), retrieved Feb. 23, 2017.

* cited by examiner

*Primary Examiner* — Paul Berardesca
(74) *Attorney, Agent, or Firm* — Fitzpatrick, Cella, Haper & Scinto

(57) ABSTRACT

A current-voltage converter, comprising an operational amplifier having an input terminal and an output terminal, a first resistor portion connected to the input terminal, and a second resistor portion provided between the input and output terminals, the input terminal and the first and second resistor portions being connected to each other, the first resistor portion being connected to a current source on a side opposite to the input terminal, the second resistor portion including a diode, the first resistor portion having a first resistance value when a current of a first current amount is supplied to the first resistor portion, and having a second resistance value smaller than the first resistance value when a current of a second current amount larger than the first current amount is supplied to the first resistor portion.

14 Claims, 6 Drawing Sheets

FIG. 2

| | COMPARATIVE EXAMPLE | | | EMBODIMENT | | |
|---|---|---|---|---|---|---|
| $I_{PD}$ [μA] | R1 [kΩ] | $V_{100A}$ [V] | $V_{OUT}$ [V] | R1 [kΩ] | $V_{100A}$ [V] | $V_{OUT}$ [V] |
| 100 | 10 | 1.50 | 2.60 | 10 | 1.50 | 2.60 |
| 120 | 10 | 1.30 | 2.62 | 10 | 1.30 | 2.62 |
| 140 | 10 | 1.10 | 2.64 | 10 | 1.10 | 2.64 |
| 160 | 10 | 0.90 | 2.66 | 10 | 0.90 | 2.66 |
| 180 | 10 | 0.70 | 2.68 | 1 | 2.32 | 2.68 |
| 200 | 10 | 0.50 | 2.70 | 1 | 2.30 | 2.70 |
| 220 | 10 | 0.30 | 2.72 | 1 | 2.28 | 2.72 |

CURRENT-VOLTAGE CONVERTER, PHOTOELECTRIC CONVERSION DEVICE, AND CAMERA

BACKGROUND OF THE INVENTION

Field of the Invention

The present invention relates to a current-voltage converter, a photoelectric conversion device, and a camera.

Description of the Related Art

A current-voltage converter (transimpedance amplifier) includes, for example, an operational amplifier and a feedback resistor provided on the path between the inverting input terminal and the output terminal of the operational amplifier. The non-inverting input terminal of the operational amplifier is fixed to a predetermined voltage. The current-voltage converter receives a current at the inverting input terminal and outputs a voltage corresponding to the amount of current from the output terminal. Such a current-voltage converter can be used to detect, for example, a current from a photodiode (that is, the amount of charge generated by photoelectric conversion).

As a feedback resistor, an element having a predetermined impedance, such as a resistor element or diode, can be used (see Japanese Patent Laid-Open No. 2000-315923). The gain of current-voltage conversion can be increased by increasing the resistance value of the feedback resistor. On the other hand, this makes the current-voltage converter easily oscillate. Some current-voltage converter has an input resistor provided at the inverting input terminal of an operational amplifier (see Japanese Patent Laid-Open No. 11-008517). Increasing the resistance value of the input resistor can make it difficult for the current-voltage converter to oscillate.

The above input resistor causes a potential difference based on its resistance value and an input current amount. For this reason, increasing the resistance value of the input resistor leads to the application of a voltage higher than expected to a current detection target (the photodiode in the above case), when the input current amount is larger than expected. As a result, the current detection target may be caused to perform an inappropriate operation. This is equivalent to that the range of input current amounts that allow the current-voltage converter to perform current-voltage conversion is narrow.

SUMMARY OF THE INVENTION

It is an object of the present invention to provide a technique advantageous in expanding the range of input current amounts that allow a current-voltage converter to perform current-voltage conversion.

One of the aspects of the present invention provides a current-voltage converter, comprising an operational amplifier having an input terminal and an output terminal, a first resistor portion connected to the input terminal, and a second resistor portion provided between the input terminal and the output terminal, wherein the input terminal of the operational amplifier, the first resistor portion, and the second resistor portion are connected to each other, the first resistor portion is connected to a current source on a side opposite to the input terminal and configured to receive all currents from the current source, the second resistor portion includes a diode configured to cause the current-voltage converter to perform logarithmic compression of a current received by the first resistor portion, the first resistor portion has a first resistance value when a current of a first current amount is supplied to the first resistor portion, and the first resistor portion has a second resistance value smaller than the first resistance value when a current of a second current amount larger than the first current amount is supplied to the first resistor portion.

Further features of the present invention will become apparent from the following description of exemplary embodiments with reference to the attached drawings.

BRIEF DESCRIPTION OF THE DRAWINGS

FIG. 2 is a table for explaining the differences in current-voltage conversion characteristics between an embodiment and a comparative example;

DESCRIPTION OF THE EMBODIMENTS

Figure 1:
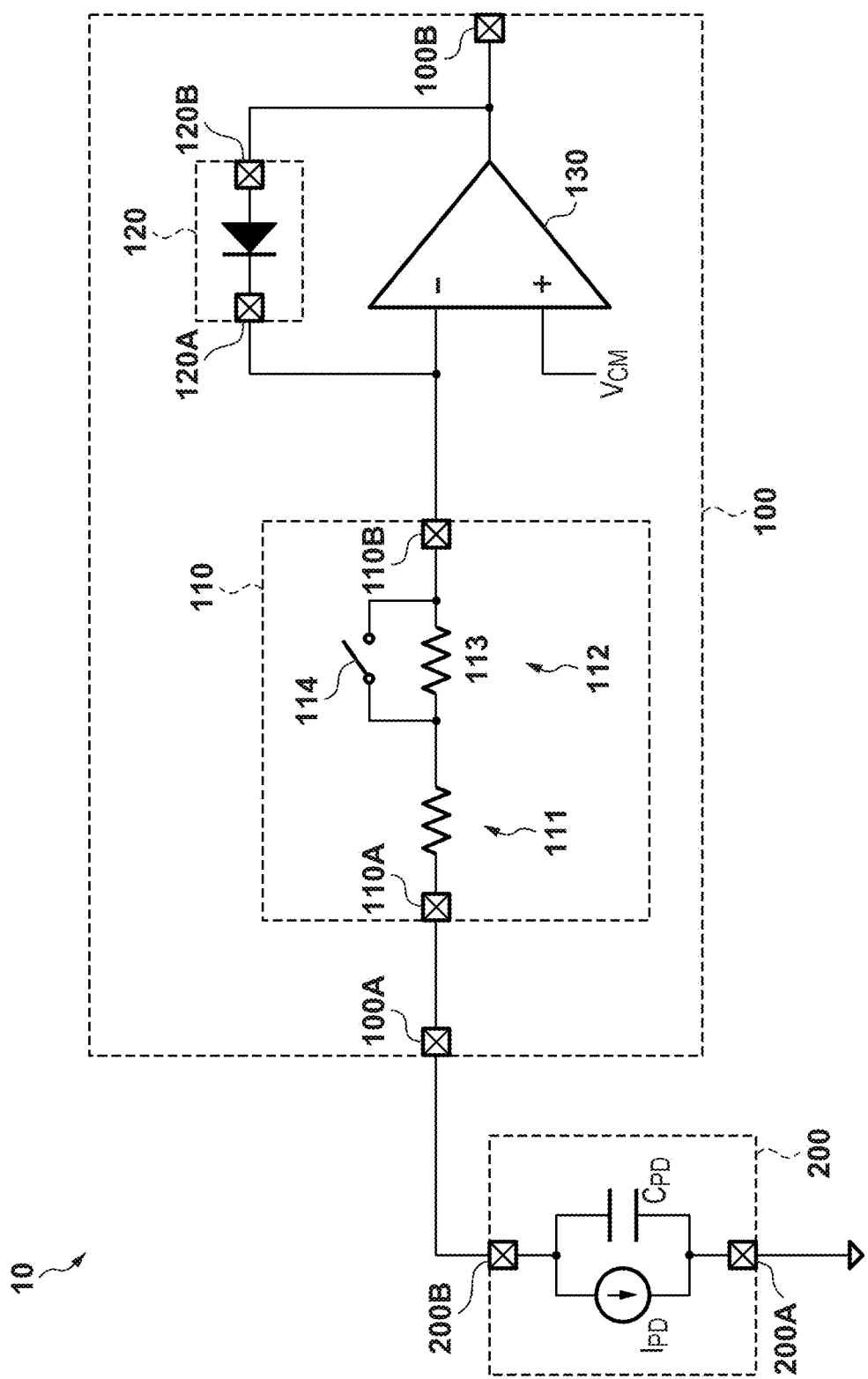
FIG. 1 is a circuit diagram for explaining an example of the arrangement of a photoelectric conversion device.

Preferred embodiments of the present invention will be described below with reference to the accompanying drawings. Note that the respective drawings are shown only for the purpose of explaining structures or arrangements, and the dimensions of the respective members do not necessarily reflect actual ones. The same reference numerals denote the same members or the same constituent elements, and a description of redundant information will be omitted. Note that each term below is used only for the purpose of explaining the present invention. Obviously, the present invention is not limited to the strict meanings of the respective terms, and can include their equivalents.

First Embodiment

The first embodiment will be described with reference to FIGS. 1 and 2. FIG. 1 shows an example of the arrangement of a photoelectric conversion device 10. The photoelectric conversion device 10 includes a current-voltage converter 100 and a photodiode 200.

The current-voltage converter 100 includes an input terminal 100A, an output terminal 100B, a first resistor portion 110, a second resistor portion 120, and an operational amplifier 130. The input terminal 100A is a terminal (first terminal) for receiving a current as a current-voltage conversion target. The output terminal 100B is a terminal (second terminal) for outputting a voltage corresponding to the current received by the input terminal 100A. The first resistor portion 110 includes two terminals 110A and 110B, and has a resistance component with a resistance value R1. The second resistor portion 120 includes two terminals 120A and 120B, and has a resistance component with a resistance value R2. The operational amplifier 130 is an operational amplifier having an inverting input terminal ("−" in FIG. 1), a non-inverting input terminal ("+" in FIG. 1), and an output terminal.

For the sake of descriptive convenience, signs are attached to the terminals of the respective units described above. These units can be formed on a single semiconductor substrate. Therefore, the term "terminal" does not necessarily indicate an electrode for external connection such as an electrode pad, and typically indicates a conductive member (for example, part of a wiring pattern) in a wiring structure on a semiconductor substrate.

The input terminal 100A is connected to one terminal 110A of the first resistor portion 110. The output terminal 100B is connected to one terminal 120A of the second resistor portion 120 and the output terminal of the operational amplifier 130. The inverting input terminal of the operational amplifier 130, the other terminal 110B of the first resistor portion 110, and the other terminal 120B of the second resistor portion 120 are connected to each other. The non-inverting input terminal of the operational amplifier 130 is fixed to a reference voltage $V_{CM}$.

The second resistor portion 120 uses a diode in this embodiment. However, this portion may use an element having a predetermined impedance component such as a resistor element. The diode of the second resistor portion 120 is arranged to make a current $I_{PD}$ as a current-voltage conversion target (whose current amount is represented by a "current amount $I_{PD}$") flow in the forward direction. That is, the anode and the cathode of the diode are respectively located on the terminal 120B side and the terminal 120A side. When the second resistor portion 120 uses a diode, the amount of current flowing in the second resistor portion 120 (the current amount $I_{PD}$ to be described later) is inversely proportional to a small-signal equivalent impedance (to be referred to as the resistance value R2 hereinafter) of the second resistor portion 120. The larger the current amount $I_{PD}$, the smaller the resistance value R2. More specifically, the resistance value R2 is given as R2=2.6 [kΩ] when, for example, $I_{PD}$=10 [μA], and is given as R2=26 [kΩ] when, for example, $I_{PD}$=1 [mA].

The photodiode 200 is connected to the input terminal 100A of the current-voltage converter 100. More specifically, the photodiode 200 has a PN junction, with an anode 200A being grounded, and a cathode 200B being connected to the input terminal 100A. For the sake of understanding, FIG. 1 shows an equivalent circuit. The photodiode 200 includes a current source which outputs the current $I_{PD}$ of an amount corresponding to the amount of light received and a parasitic capacitance $C_{PD}$ (whose capacitance value is represented by a "capacitance value $C_{PD}$") as the capacitance component of the PN junction between the anode 200A and the cathode 200B. At the time of an operation (that is, at the time of photoelectric conversion), the voltage between the anode 200A and the cathode 200B is maintained to set the PN junction in a reverse bias state. This guides the electrons of electron-hole pairs generated by photoelectric conversion to the N region, and guides the holes to the P region. Although this embodiment has exemplified the arrangement using the photodiode 200, it is possible to use another type of photoelectric conversion element or an element which generates a current based on an external factor other than light.

With this arrangement, the current-voltage converter 100 converts the current $I_{PD}$ generated by the photodiode 200 into a voltage, and a signal corresponding to the voltage is output to a processor (not shown) via the output terminal 100B. The processor may be an ASIC or a CPU, FPGA, or the like which operates based on a predetermined program. For example, the photoelectric conversion device 10 can be applied to a distance measuring device for calculating a distance to a target based on reflected light from the target. In this case, the processor calculates a distance to the target based on a signal from the current-voltage converter 100. In addition, using for the second resistor portion 120, a diode exhibiting a natural logarithmic relationship between current amounts and voltages between the two terminals allows the current-voltage converter 100 to function as a logarithmic amplifier. This can increase the range of input current amounts that allow current-voltage conversion.

The first resistor portion 110 is configured such that a resistance value occurring at the time of the supply of a large current is smaller than that occurring at the time of the supply of a small current. In this case, the terms "large current" and "small current" are used for the sake of convenience. For example, a large current can be a current with a current value almost equal to or more than 100 [μA], and a small current can be a current with a current value almost equal to or less than 100 [μA]. Since these definitions can change depending on circuit arrangements, a reference value may be provided in accordance with the circuit arrangement to roughly classify current amounts based on whether they are larger than the reference value. For the sake of easy explanation, such currents may be simply expressed as a "large current" or "small current".

In this embodiment, the first resistor portion 110 includes a first portion 111 and a second portion 112 which respectively have resistance components and are connected in series. In the embodiment, the first portion 111 is a resistor element having an inherent resistance value R11. This resistor element may be formed from, for example, polysilicon formed on a semiconductor substrate or may be an impurity region formed in a semiconductor substrate.

In addition, the second portion 112 has a variable resistance value R12 and is configured such that when a potential difference $V_{DROP}$ between the two terminals (110A and 110B) of the first resistor portion 110 becomes larger than a reference value, the resistance value R12 becomes small. More specifically, the second portion 112 includes a resistor element 113 and a switch 114 arranged in parallel. The resistor element 113 may be formed from, for example, polysilicon formed on a semiconductor substrate or may be an impurity region formed in a semiconductor substrate.

The switch 114 shorts the two terminals of the resistor element 113 when an input current is a large current. That is, the second portion 112 turns on the switch 114 to inhibit the potential difference $V_{DROP}$ between the two terminals of the first resistor portion 110 from further increasing when the potential difference $V_{DROP}$ becomes larger than a reference value. This clips a predetermined voltage (voltage $V_{CLIP}$). In other words, the switch 114 maintains the potential difference between the two terminals of the resistor element 113 at the voltage $V_{CLIP}$. From this point of view, the second portion 112 may be termed as a voltage clip portion.

If the resistance value R12 of the second portion 112 is given as R12≈0 when the switch 114 is ON, the resistance value R1 of the first resistor portion 110 is given as $R1=R11+R12;$ when switch 114 is OFF $R1≈R11;$ when switch 114 is ON
The potential difference $V_{DROP}$ is given as $V_{DROP}=I_{PD}×(R11+R12);$ when switch 114 is OFF $V_{DROP}=I_{PD}×R11+V_{CLIP};$ when switch 114 is ON
In this case, in consideration that the inverting input terminal and the non-inverting input terminal of the operational amplifier 130 are virtually shorted to each other at the time of an operation, a potential $V_{100A}$ of the input terminal 100A is given as $$V_{100A} = V_{CM} - V_{DROP}$$

In this case, as described above, in order to properly implement photoelectric conversion in the photodiode 200, the voltage between the anode 200A and the cathode 200B needs to be maintained to keep the PN junction in the reverse bias state.

A case in which the second portion 112 (or the switch 114) is not arranged (or a case in which the switch 114 is not turned on) will be considered as a comparative example. In this case, as the current $I_{PD}$ becomes a large current, the potential $V_{100A}$ (that is, the potential of the cathode 200B ($=V_{CM}-V_{DROP}$)) greatly drops. As a result, a voltage enough to set the PN junction in the reverse bias state is not applied between the anode 200A and the cathode 200B, and hence photoelectric conversion is not properly performed. In other words, this is equivalent to that the range of input current amounts that allow current-voltage conversion is limited.

According to this embodiment, when the current $I_{PD}$ becomes a large current, the switch 114 of the second portion 112 is turned on to reduce the potential difference $V_{DROP}$ between the two terminals of the first resistor portion 110. For this reason, the potential $V_{100A}$ does not drop so much as compared with the above comparative example. Therefore, according to the embodiment, even when the current $I_{PD}$ is a large current, photoelectric conversion can be properly performed, resulting in broadening the range of input current amounts that allow the current-voltage converter 100 to perform current-voltage conversion as compared with the above comparative example. The resistance value R11 is preferably set to a comparatively small value so as to maintain the PN junction of the photodiode 200 in the reverse bias state even when the current $I_{PD}$ becomes a large current. For example, the resistance value R11 is preferably set to a value smaller than the resistance value R12 (substantially the resistance value of the resistor element 113) when the switch 114 is OFF.

A voltage (output voltage) $V_{OUT}$ of the output terminal 100B of the current-voltage converter 100 can be expressed as $$V_{OUT} \approx V_{CM} + V_T \times \ln(I_{PD}/I_S) \quad (1)$$

$V_{CM}$: thermal voltage proportional to absolute temperature $I_S$: reverse saturation current It is obvious from expression (1) that the current amount $I_{PD}$ is logarithmically compressed and current-voltage converted, that is, the current-voltage converter 100 functions as a logarithmic amplifier. According to this embodiment, the PN junction of the photodiode 200 is maintained in the reverse bias state, and photoelectric conversion is properly performed even when the current $I_{PD}$ is a large current as well as the current $I_{PD}$ is a small current. This implements current-voltage conversion based on expression (1).

As described above, when the current $I_{PD}$ is a small current (that is, the switch 114 is OFF), the resistance value R1 (=R11+R12) of the first resistor portion 110 is a relatively large value. If the operational amplifier 130 has a finite bandwidth and the operational amplifier 130 has a transfer function A(s) (s: complex frequency), the gain ($V_{OUT}/I_{PD}$) of current-voltage conversion by the current-voltage converter 100 can be expressed as $$V_{OUT}/I_{PD} = \frac{R2 \times A(s)}{s \times C_{PD} \times (R1 \times A(s) + R1 + R2) + A(s) + 1} \quad (2)$$

In addition, with the use of a unity gain angular frequency $\omega_\mu$ at which the gain becomes unity, the gain of current-voltage conversion can be expressed as $$V_{OUT}/I_{PD} \approx \frac{R2 \times \frac{\omega_\mu}{C_{PD} \times (R1 + R2)}}{s^2 + s \times \frac{\omega_\mu \times R1 \times C_{PD} + 1}{C_{PD} \times (R1 + R2)} + \frac{\omega_\mu}{C_{PD} \times (R1 + R2)}} \quad (3)$$

Note that the transfer function A(s) has one pole p1 (the current-voltage converter 100 is a so-called one-pole amplifier). Expression (3) given above uses the approximation represented by $$A(s) = \frac{DC_{GAIN}}{s/p1 + 1} = \frac{\omega_\mu}{s + p1} \approx \frac{\omega_\mu}{s} \quad (4)$$

in a frequency band (s>>p1) sufficient for assuming system stability.

In this case, when expression (3) given above is compared with a general expression of the second-order delay element of a transfer function (Zenta IWAI, et al., "Control Engineering", p. 17, expression (2.33)), a damping factor ζ (stabilization coefficient) indicating the stability of the operation (oscillation difficulty) of the photoelectric conversion device 10 can be expressed as $$\zeta = \frac{\omega_\mu \times R1 \times C_{PD} + 1}{2 \times \sqrt{\omega_\mu \times C_{PD} \times (R1 + R2)}} \quad (5)$$

The larger the damping factor ζ, the higher the stability of the operation of the photoelectric conversion device 10. When ζ<1, vibrations appear at the transient response of $V_{OUT}$. The smaller ζ, the easier oscillation occurs. For this reason, the photoelectric conversion device 10 may be designed to satisfy at least ζ≥0.4. The photoelectric conversion device 10 is preferably designed to satisfy ζ≥0.6 and is more preferably designed to satisfy ζ≥0.7.

As described above, as the current $I_{PD}$ decreases, the resistance value R2 of the second resistor portion 120 increases in inverse proportion to the current. In order to stabilize the operation of the photoelectric conversion device 10, according to equation (5), as the resistance value R2 increases, it is necessary to also increase the resistance value R1 of the first resistor portion 110. In this embodiment, when the current $I_{PD}$ is a small current, since the switch 114 is OFF in the second portion 112, the resistance value of the resistor element 113 may be set to a large value to increase the resistance value R1. This will set the resistance value R2 of the second resistor portion 120 to a relatively large value. However, the resistance value R1 of the first resistor portion 110 is also set to a large value, and hence the stability of the operation of the photoelectric conversion device 10 can be ensured.

In contrast, when the current $I_{PD}$ is a large current, the switch 114 is ON in the second portion 112 of the first resistor portion 110, and hence the two terminals of the resistor element 113 are shorted (resistance value R12 of second portion 112≈0) to set resistance value R1≈R11 (a relatively smaller value). When, however, the current $I_{PD}$ increases, since the resistance value R2 of the second resistor portion 120 decreases in inverse proportion to the current, thereby ensuring the stability of the operation of the photoelectric conversion device 10.

This embodiment has exemplified the structure of the first resistor portion 110 which is separately provided with the first portion 111 and the second portion 112. In this case, in the second portion 112, the resistance value R12 of the second portion 112 when the switch 114 is ON is actually represented by R12>0. According to another example, therefore, the first resistor portion 110 can be formed from only the second portion 112 (without using the first portion 111) by adjusting the resistance value R12 set when the switch 114 is OFF and the resistance value R12 set when the switch 114 is ON.

The differences in current-voltage conversion characteristics between the above comparative example and one example of this embodiment will be described with reference to FIG. 2. Assume that reference voltage $V_{CM}$=2.5 [V]. For the sake of easy understanding, the second resistor portion 120 has resistance value R2=1 [kΩ] (fixed value). In this case, the output voltage $V_{OUT}$ is given as $$V_{OUT} = V_{CM} + I_{PD} \times R2$$

In addition, the potential $V_{100A}$ of the input terminal 100A (that is, the voltage between the anode 200A and the cathode 200B) is given as $$V_{100A} = V_{CM} - V_{DROP} = V_{CM} - I_{PD} \times R1$$

Assume that in the comparative example, the first resistor portion 110 has resistance value R1=10 [kΩ] (fixed value). In this case, in the range of $I_{PD}$<180 [μA], $V_{100A}$>0.7 [V], and the PN junction of the photodiode 200 is maintained in the reverse bias state, thus allowing the photodiode 200 to properly perform photoelectric conversion. In contrast to this, in the range of $I_{PD}$≥180 [μA], $V_{100A}$≤0.7 [V], and the reverse bias applied to the PN junction decreases. This may make it difficult for the photodiode 200 to properly perform photoelectric conversion.

In contrast to this, assume that in the example of this embodiment, the resistance value R1 of the first resistor portion 110 is variable, R1=10 [kΩ] in the range of $I_{PD}$<180 [μA] (equal to that in the comparative example), and R1=1 [kΩ] in the range of $I_{PD}$≥180 [μA]. More specifically, the first portion 111 of the first resistor portion 110 has resistance value R11=1 [kΩ], and the second portion 112 has resistance value R12=9 [kΩ] when the switch 114 is OFF, and resistance value R12=0 [kΩ] when the switch 114 is ON.

In this case, the resistance value R1 in the range of $I_{PD}$<180 [μA] is equal to that in the comparative example. In contrast to this, in the range of $I_{PD}$≥180 [μA], since R1=1 [kΩ], the potential $V_{100A}$ does not become equal to or less than 0.7 [V]. That is, the photodiode 200 is maintained in the reverse bias state to allow the photodiode 200 to properly perform photoelectric conversion.

Note that in this embodiment, 0.7 [V] is selected as a reference for switching resistance values. However, a threshold for bias conditions for proper photoelectric conversion is set as needed in accordance with the characteristics of the photodiode 200. In general, as a reverse bias voltage decreases, it becomes more difficult to perform photoelectric conversion. However, depending on the characteristics of the photodiode 200, even a forward bias state allows photoelectric conversion.

As described above, according to this embodiment, it is possible to properly perform current-voltage conversion even when the current $I_{PD}$ is a large current as well as when the current $I_{PD}$ is a small current. Therefore, according to the embodiment, it is possible to broaden the range of input current amounts that allow current-voltage conversion.

Second Embodiment

Figure 3:
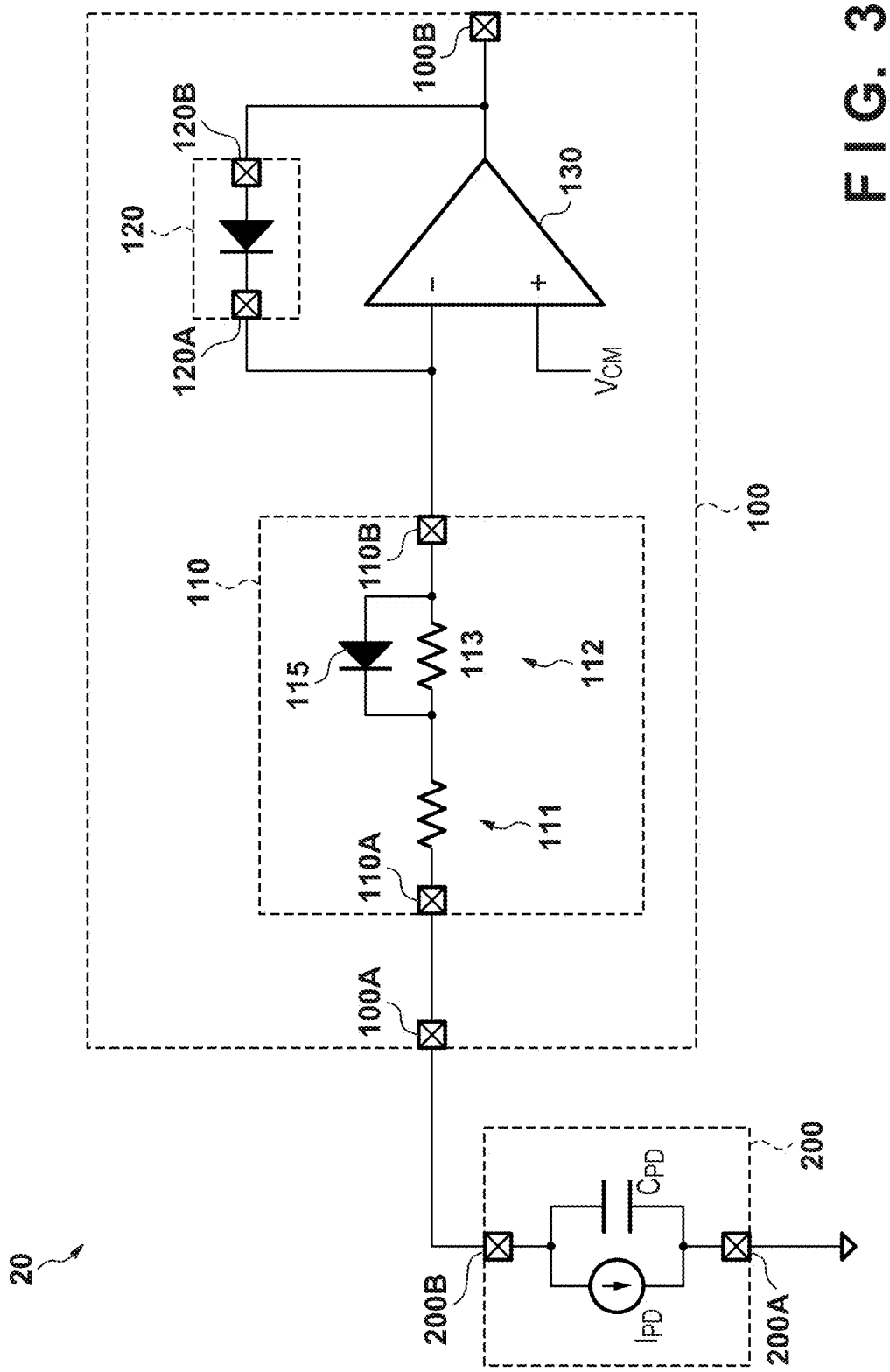
FIG. 3 is a circuit diagram for explaining an example of the arrangement of a photoelectric conversion device.

The second embodiment will be described with reference to FIGS. 3 to 5. FIG. 3 shows an example of the arrangement of a photoelectric conversion device 20. The photoelectric conversion device 20 has the same arrangement as that of the photoelectric conversion device 10 according to the first embodiment except that the arrangement of the first resistor portion 110 of the current-voltage converter 100 is partly changed with respect to the photoelectric conversion device 10. More specifically, the photoelectric conversion device 20 differs from the photoelectric conversion device 10 in that a second portion 112 of the first resistor portion 110 includes a resistor element 113 and a diode 115 (used in place of the switch 114) arranged in parallel. The anode and the cathode of the diode 115 are respectively located on the terminal 110B side and the first portion 111 side. This arrangement can also obtain the same effects as those of the first embodiment described above.

The diode 115 exhibits an inversely proportional relationship between current amounts and resistance values like the diode of the second resistor portion 120 described above. That is, when a current amount $I_{PD}$ is a small current, the resistance value of the diode 115 is relatively large, whereas when the current amount $I_{PD}$ is a large current, the resistance value of the diode 115 is relatively small. For this reason, when the potential difference between the two terminals of the second portion 112 (the two terminals of each of the resistor element 113 and the diode 115) becomes larger than a reference value, the resistance value of the diode 115 becomes smaller than that of the resistor element 113, and most of the current amount $I_{PD}$ flows in the diode 115. That is, when the potential difference between the two terminals of the second portion 112 becomes larger than the reference value, the diode 115 passes a current to inhibit a further increase in the potential difference. The potential difference is equivalent to the threshold voltage of the diode 115 and corresponds to the above voltage $V_{CLIP}$. In the following description, for the sake of descriptive convenience, a state in which a voltage equal to or more than the threshold voltage is applied to the diode 115 is expressed as an "ON state", and a state in which a voltage equal to or more than the threshold voltage is not applied to the diode 115 is expressed as an "OFF state".

Assume that in this case, a resistance value R11 of a first portion 111 is expressed as $R11=0.3$ [kΩ]

In addition, the threshold voltage of the diode 115 corresponding to the voltage $V_{CLIP}$ is set to 0.6 [V].

For the sake of easy understanding, the resistance component of the diode 115 is very large when the diode 115 is in the OFF state, whereas the diode 115 does not substantially include any resistance component when the diode 115 is in the ON state. That is, a resistance value R12 of the second portion 112 is given as $R12=9.0$ [kΩ];

when diode 115 is in OFF state $R12≈0$ [kΩ];

when diode 115 is in ON state

Therefore, a resistance value R1 (=R11+R12) of the first resistor portion 110 is given as $R1=9.3$ [kΩ];

when diode 115 is in OFF state $R1=0.3$ [kΩ];

when diode 115 is in ON state

In addition, assume that a parasitic capacitance $C_{PD}$ of a photodiode 200 is given as $C_{PD}=50$ [pF]

Assume also that a unity gain angular frequency $\omega_\mu$ of the operational amplifier 130 is given as $\omega_\mu=120$ [Mrad/s]

Figure 4A:
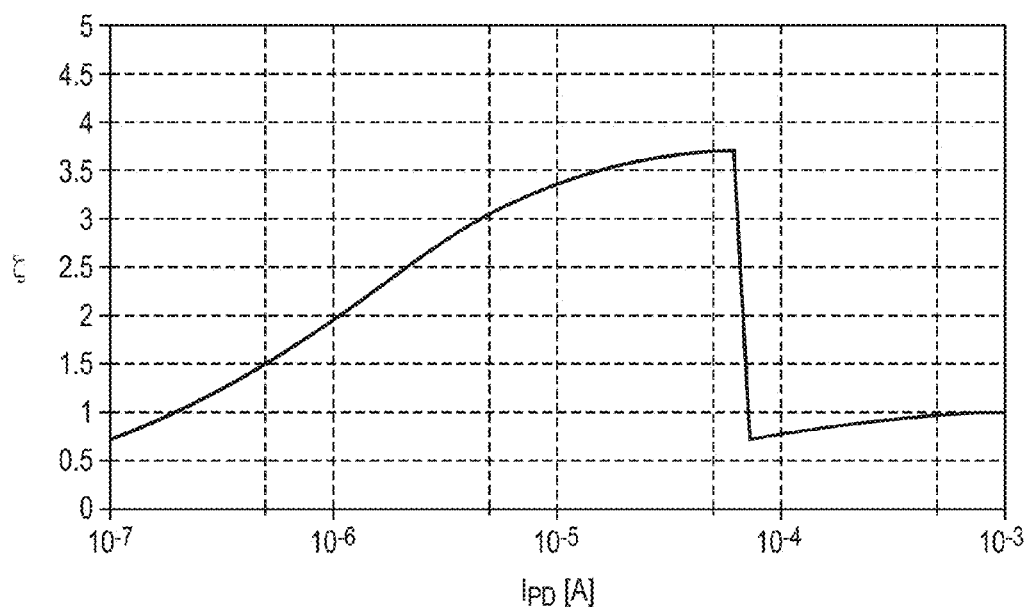
FIGS. 4A and 4B are graphs for explaining the stability of the operation of the photoelectric conversion device.
Figure 4B:
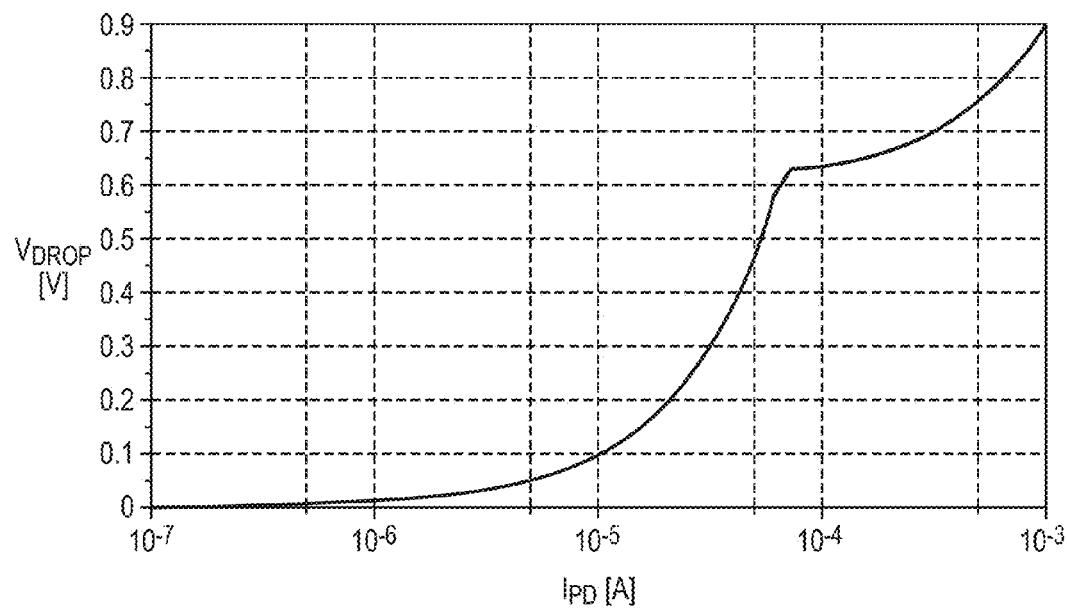

FIGS. 4A and 4B are graphs showing analysis results based on the above parameters to explain the stability of the operation of a photoelectric conversion device 20. Referring to FIG. 4A, the abscissa represents a current value $I_{PD}$ [A], and the ordinate represents the damping factor $\zeta$. Referring to FIG. 4B, the abscissa represents the current value $I_{PD}$ [A], and the ordinate represents a potential difference $V_{DROP}$ between the two terminals (110A and 110B) of the first resistor portion 110.

As described above in the first embodiment, since a potential $V_{100A}$ (=$V_{CM}-V_{DROP}$) does not decrease unless the potential difference $V_{DROP}$ is small, if the potential difference $V_{DROP}$ is smaller than a predetermined value, the PN junction of the photodiode 200 can be maintained in the reverse bias state.

As is obvious from FIGS. 4A and 4B, as the current value $I_{PD}$ increases from 0.1 [μA], the damping factor $\zeta$ and the potential difference $V_{DROP}$ become large. When the current value $I_{PD}$ becomes larger than about 80 [μA], the damping factor $\zeta$ decreases, and the amount of change in the potential difference $V_{DROP}$ becomes moderate. This indicates that the diode 115 has shifted from the OFF state to the ON state.

Referring to FIG. 4A, in the range of the current values $I_{PD}$ from 0.1 [μA] to 1 [mA], $\zeta \geq 0.7$ is maintained. Referring to FIG. 4B, in this range, the potential difference $V_{DROP}$ is equal to or less than 0.9 [V] ($I_{PD}=1$ [mA]). A reference voltage $V_{CM}$ is preferably set based on this so as to maintain the potential $V_{100A}$ (=$V_{CM}-V_{DROP}$) at a desired value (so as to maintain the PN junction of the photodiode 200 in the reverse bias state). Note that since the amount of change in the voltage of the diode 115 is about 18 [mV] even if the current amount $I_{PD}$ increases twice, the actual amount of increase in $V_{DROP}$ while the diode 115 is in the ON state is less than 0.1 [V], and a sufficient margin can be ensured for the potential $V_{100A}$. Although it is assumed here that when the diode 115 is in the ON state, R12≈0 [kΩ], since R12>0 [kΩ] in practice, the damping factor $\zeta$ becomes a larger value. This makes it possible to further stabilize the operation of the photoelectric conversion device 20.

Figure 5A:
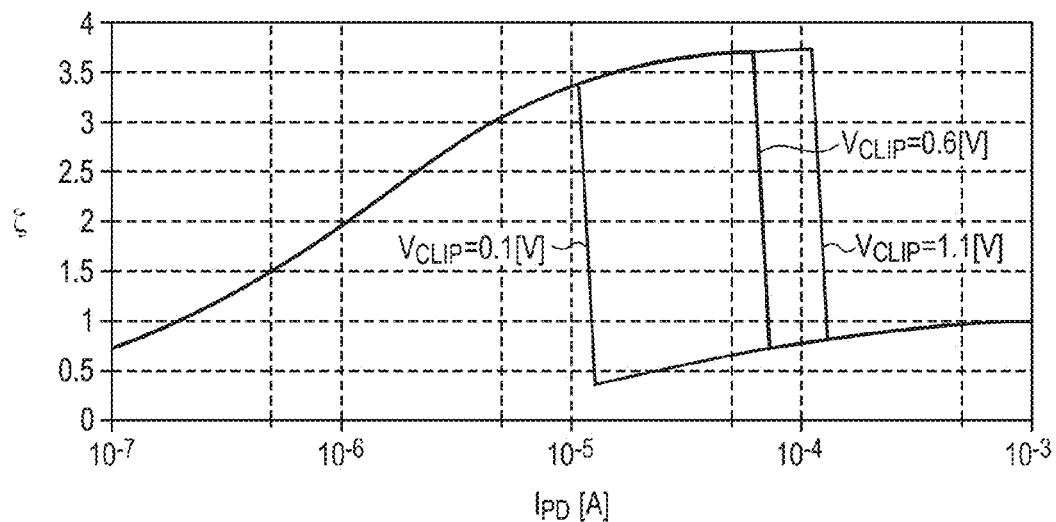
FIGS. 5A and 5B are graphs for explaining the stability of the operation of the photoelectric conversion device.
Figure 5B:
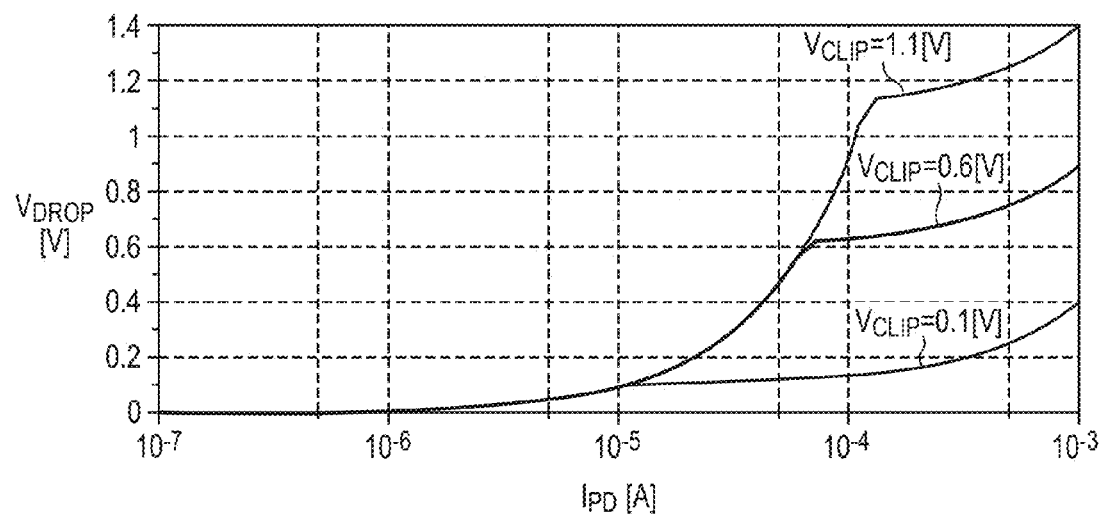

FIGS. 5A and 5B further show analysis results like FIGS. 4A and 4B, indicating a case in which $V_{CLIP}=0.1$ [V] and $V_{CLIP}=1.1$ [V], in addition to a case in which voltage $V_{CLIP}=0.6$ [V].

In the case in which $V_{CLIP}=0.1$ [V], when the smaller current amount $I_{PD}$ flows, the diode 115 is set in the ON state, and the damping factor $\zeta$ becomes a smaller value than in the case in which $V_{CLIP}=0.6$ [V]. In the case in which $V_{CLIP}=1.1$ [V], when the larger current amount $I_{PD}$ flows, the diode 115 is set in the ON state, and the damping factor $\zeta$ becomes a larger value than in the case in which $V_{CLIP}=0.6$ [V].

In the case in which $V_{CLIP}=0.1$ [V], the potential difference $V_{DROP}$ becomes smaller than in the case in which $V_{CLIP}=0.6$ [V]. In contrast to this, in the case in which $V_{CLIP}=1.1$ [V], the potential difference $V_{DROP}$ becomes larger than in the case in which $V_{CLIP}=0.6$ [V].

Therefore, the voltage $V_{CLIP}$ may be set to make both the damping factor $\zeta$ and the potential difference $V_{DROP}$ satisfy desired conditions. In this embodiment, for example, it is possible to change the voltage $V_{CLIP}$ by adjusting the P-type and/or N-type concentrations of the PN junction of the diode 115. In another example, the type of diode may be changed. For example, as the diode 115, a zener diode or Schottky diode may be used.

Third Embodiment

Figure 6:
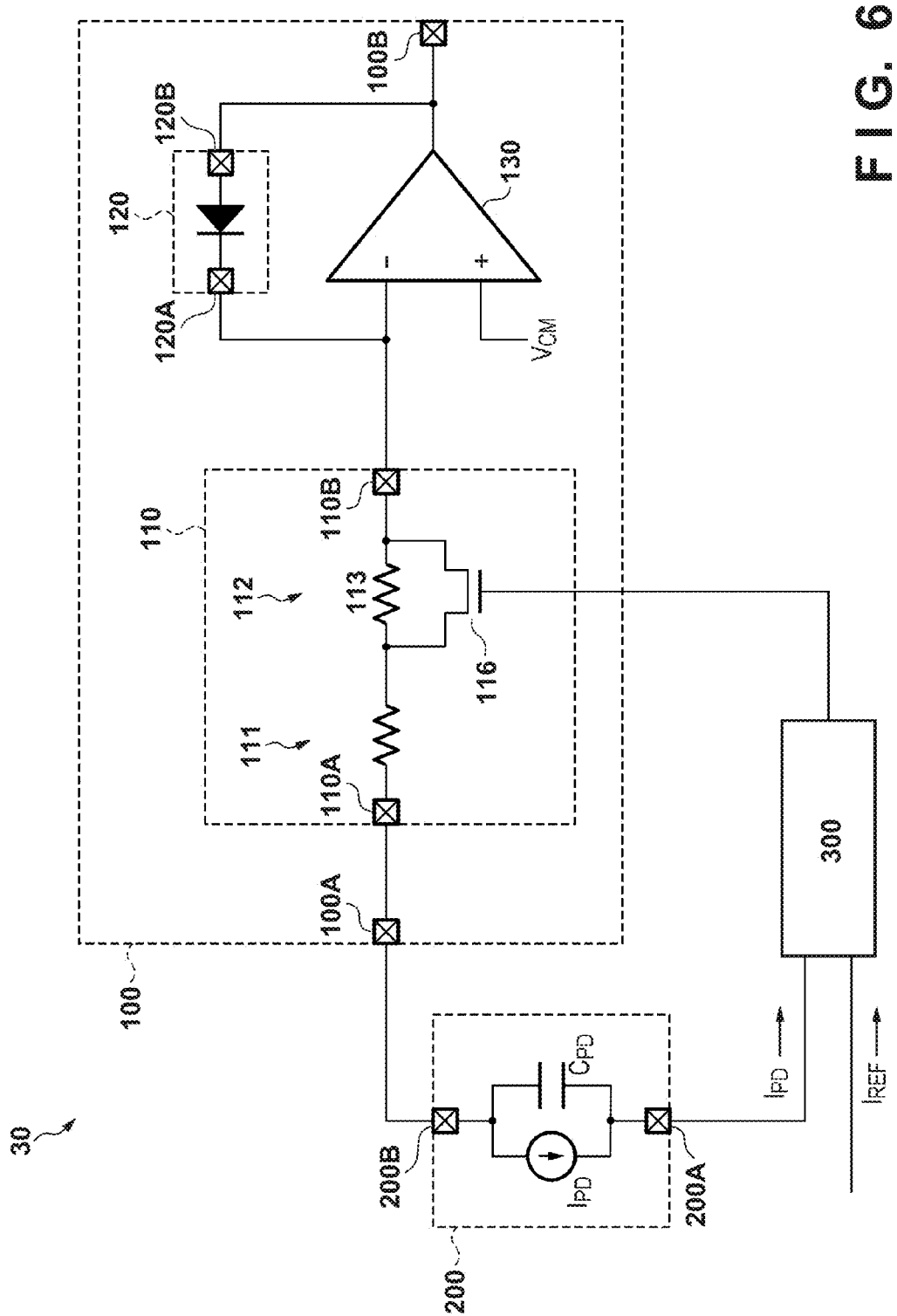
FIG. 6 is a circuit diagram for explaining an example of the arrangement of the photoelectric conversion device.

The third embodiment will be described with reference to FIG. 6. FIG. 6 shows an example of the arrangement of a photoelectric conversion device 30. The photoelectric conversion device 30 has the same arrangement as that of the photoelectric conversion device 10 according to the first embodiment described above except that the arrangement of the first resistor portion 110 is partly changed, and a controller 300 is further arranged.

More specifically, in the photoelectric conversion device 30, a second portion 112 of the first resistor portion 110 includes a resistor element 113 and a transistor 116 (used in place of the switch 114 in the first embodiment) arranged in parallel. Although this embodiment uses a MOS transistor as the transistor 116, another type of switch element such as a bipolar transistor may be used in another example.

The controller 300 is connected to an anode 200A of a photodiode 200. The controller 300 monitors a current amount $I_{PD}$ from the photodiode 200 and controls the transistor 116 based on the monitoring results. More specifically, the controller 300 can include a comparator (not shown) which compares the current amount $I_{PD}$ with a reference current amount $I_{REF}$. With this arrangement, the controller 300 turns off the transistor 116 when the current amount $I_{PD}$ is smaller than the reference current amount $I_{REF}$, and turns on the transistor 116 when the current amount $I_{PD}$ is larger than the reference current amount $I_{REF}$.

When the transistor 116 is set in the ON state, the potential difference between the two terminals of the resistor element 113 becomes substantially 0 [V] (that is, voltage $V_{CLIP}\approx 0$ [V] in this embodiment). This makes it possible to reduce a voltage drop (that is, a potential difference $V_{DROP}$) at the first resistor portion 110, thus making it difficult for a potential $V_{100A}$ (=$V_{CM}-V_{DROP}$) to drop. As a result, the PN junction of the photodiode 200 can be maintained in the reverse bias state. Therefore, this embodiment can obtain the same effects as those of the first embodiment described above.

(Others)

Although a few preferred embodiments have been exemplified, the present invention is not limited to them. These embodiments may be partly changed within the scope of the present invention. For example, in the above case, although the single second portion 112 is used in the first resistor portion 110, a plurality of second portions 112 may be arranged, and switches 114, diodes 115, and/or transistors 116 may be configured to be set in the ON state one by one (stepwise). This allows the resistance value R1 of the first resistor portion 110 to have multiple values.

The photoelectric conversion device exemplified by each embodiment may be applied to a distance measuring device which calculates a distance to a target based on reflected light from the target or to a camera (image capturing system) having a distance measuring function. In another example, this device may be applied to a light control device which adjusts the amount of stroboscopic light based on the amount of reflected light or to a camera having a light control function. The concept of the camera includes not only an apparatus mainly aiming at image capturing but also an apparatus (for example, a personal computer or portable terminal) accessorily having an image capturing function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-060899, filed on Mar. 24, 2016, which is hereby incorporated by reference herein in its entirety.

What is claimed is:

1. A current-voltage converter comprising:
an operational amplifier having an input terminal and an output terminal;
a first resistor portion connected to the input terminal; and
a second resistor portion provided between the input terminal and the output terminal,
wherein the input terminal of the operational amplifier, the first resistor portion, and the second resistor portion are connected to each other,
the first resistor portion is connected to a current source on a side opposite to the input terminal and configured to receive all currents from the current source,
the second resistor portion includes a diode configured to cause the current-voltage converter to perform logarithmic compression of a current received by the first resistor portion,
the first resistor portion has a first resistance value when a current of a first current amount is supplied to the first resistor portion, and
the first resistor portion has a second resistance value smaller than the first resistance value when a current of a second current amount larger than the first current amount is supplied to the first resistor portion.

2. The converter according to claim 1, wherein the second resistor portion is configured to have a smaller resistance value with an increase in amount of current supplied to the first resistor portion.

3. The converter according to claim 1, wherein the second resistor portion includes a diode.

4. The converter according to claim 1, wherein the first resistor portion includes a first portion and a second portion respectively having resistance components and connected in series, and
the second portion is configured to have a smaller resistance value as a potential difference between two terminals of the second portion becomes larger than a reference value.

5. The converter according to claim 4, wherein the second portion includes a resistor element and a diode arranged in parallel.

6. The converter according to claim 1, wherein the first resistor portion includes a first portion and a second portion respectively having resistance components and connected in series,
the second portion includes a resistor element and a switch arranged in parallel,
the switch is set in an OFF state when an amount of current supplied to the first resistor portion is the first current amount, and
the switch is set in an ON state to short two terminals of the resistor element when an amount of current supplied to the first resistor portion is the second current amount.

7. The converter according to claim 6, wherein the switch includes a MOS transistor.

8. The converter according to claim 6, further comprising a controller configured to set the switch in an ON state when an amount of current supplied to the first resistor portion is larger than the first current amount.

9. A photoelectric conversion device comprising:
a current-voltage converter; and
a photoelectric conversion element,
the current-voltage converter comprising
an operational amplifier having an input terminal and an output terminal,
a first resistor portion connected to the input terminal, and
a second resistor portion provided between the input terminal and the output terminal,
wherein the input terminal of the operational amplifier, the first resistor portion, and the second resistor portion are connected to each other,
the first resistor portion is connected to a current source on a side opposite to the input terminal and arranged to receive all currents from the current source,
the second resistor portion includes a diode configured to cause the current-voltage converter to perform logarithmic compression of a current received by the first resistor portion,
the first resistor portion has a first resistance value when a current of a first current amount is supplied to the first resistor portion,
the first resistor portion has a second resistance value smaller than the first resistance value when a current of a second current amount larger than the first current amount is supplied to the first resistor portion, and
the photoelectric conversion element is connected as the current source to the input terminal via the first resistor portion.

10. The device according to claim 9, wherein the photoelectric conversion element comprises a photodiode having a PN junction, and
a resistance value of the first resistor portion changes in accordance with a current amount from the photodiode so as to maintain the PN junction of the photodiode in a reverse bias state.

11. The device according to claim 10, wherein letting $\omega_\mu$ be a unity gain angular frequency of the operational amplifier, $C_{PD}$ be a capacitance value of a capacitance component of the photoelectric conversion element, R1 be a resistance value of the first resistor portion, and R2 be a resistance value of the second resistor portion, a damping factor $\zeta$ given by $$\zeta = \frac{\omega_\mu \times R1 \times C_{PD} + 1}{2 \times \sqrt{\omega_\mu \times C_{PD} \times (R1 + R2)}}$$

satisfies $\zeta \geq 0.4$ both when a current of the first current amount is supplied to the first resistor portion and when a current of the second current amount is supplied to the first resistor portion.

12. The device according to claim 11, wherein the damping factor $\zeta$ further satisfies $\zeta \geq 0.6$ both when a current of the first current amount is supplied to the first resistor portion and when a current of the second current amount is supplied to the first resistor portion.

13. The device according to claim 12, wherein the damping factor $\zeta$ further satisfies $\zeta \geq 0.7$ both when a current of the first current amount is supplied to the first resistor portion and when a current of the second current amount is supplied to the first resistor portion.

14. A camera comprising a photoelectric conversion device,
the photoelectric conversion device comprising a current-voltage converter and a photoelectric conversion element, and
the current-voltage converter comprising
an operational amplifier having an input terminal and an output terminal,
a first resistor portion connected to the input terminal, and
a second resistor portion provided between the input terminal and the output terminal,
wherein the input terminal of the operational amplifier, the first resistor portion, and the second resistor portion are connected to each other,
the first resistor portion is connected to a current source on a side opposite to the input terminal and arranged to receive all currents from the current source,
the second resistor portion includes a diode configured to cause the current-voltage converter to perform logarithmic compression of a current received by the first resistor portion,
the first resistor portion has a first resistance value when a current of a first current amount is supplied to the first resistor portion,
the first resistor portion has a second resistance value smaller than the first resistance value when a current of a second current amount larger than the first current amount is supplied to the first resistor portion, and
the photoelectric conversion element is connected as the current source to the input terminal via the first resistor portion.

\* \* \* \* \*